(12) United States Patent
Anezaki

(10) Patent No.: US 7,511,331 B2
(45) Date of Patent: Mar. 31, 2009

(54) SEMICONDUCTOR DEVICE HAVING SIDE WALL SPACERS

(75) Inventor: Toru Anezaki, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 0 days.

(21) Appl. No.: 12/007,420

(22) Filed: Jan. 10, 2008

(65) Prior Publication Data
US 2008/0142871 A1 Jun. 19, 2008

Related U.S. Application Data

(60) Division of application No. 11/390,128, filed on Mar. 28, 2006, now abandoned, which is a continuation of application No. PCT/JP03/13582, filed on Oct. 23, 2003.

(51) Int. Cl.
*H01L 29/76* (2006.01)
*H01L 29/788* (2006.01)

(52) U.S. Cl. .............. 257/315; 257/326; 257/E29.129; 257/E29.3

(58) Field of Classification Search ......... 257/314–317, 257/326, 390, 321, E29.129, E29.3
See application file for complete search history.

(56) References Cited

U.S. PATENT DOCUMENTS

| | | | |
|---|---|---|---|
| 5,352,620 A | 10/1994 | Komori et al. | |
| 5,468,987 A | 11/1995 | Yamazaki et al. | |
| 5,753,546 A | 5/1998 | Koh et al. | |
| 6,344,388 B1 | 2/2002 | Oishi et al. | |
| 6,744,099 B2 | 6/2004 | Tsuchiya et al. | |
| 6,815,288 B2 * | 11/2004 | Kim | 438/241 |
| 6,906,360 B2 | 6/2005 | Chen et al. | |

| | | |
|---|---|---|
| 2002/0041000 A1 | 4/2002 | Watanabe et al. |
| 2003/0067045 A1 | 4/2003 | Sugiyama et al. |
| 2005/0258474 A1 | 11/2005 | Tanaka et al. |

FOREIGN PATENT DOCUMENTS

| | | |
|---|---|---|
| JP | 04-158530 A | 6/1992 |
| JP | 9-162396 | 6/1997 |
| JP | 10-321738 | 12/1998 |

(Continued)

OTHER PUBLICATIONS

International Search Report of International Application PCT/JP2003/013582 mailed Jan. 27, 2004.

(Continued)

*Primary Examiner*—Hoai v Pham
(74) *Attorney, Agent, or Firm*—Westerman, Hattori, Daniels & Adrian, LLP.

(57) ABSTRACT

A semiconductor device is provided which has insulating film side wall spacers having a barrier function. The semiconductor device comprises: a gate oxide film and a gate electrode formed on and above a semiconductor substrate; source/drain regions formed in the semiconductor substrate; and first laminated side wall spacers having two or more layers and formed on side walls of the gate electrode, the first laminated side wall spacers including a nitride film as a layer other than an outermost layer, the outermost layer being made of an oxide film or an oxynitride film and having a bottom surface contacting the semiconductor substrate, the gate oxide film or a side wall spacer layer other than the nitride film.

7 Claims, 16 Drawing Sheets

FOREIGN PATENT DOCUMENTS

| | | |
|---|---|---|
| JP | 2003-23114 | 1/2003 |
| KR | 2003-0076266 | 9/2003 |
| WO | WO 03/012878 A1 | 2/2003 |

OTHER PUBLICATIONS

Office Action dated Feb. 23, 2007, issued in corresponding Korean Application No. 10-2006-7005743.

Supplemental European Search Report dated May 23, 2008 issued in corresponding European Application No. EP 03 75 8843.

Chinese Office Action dated Mar. 7, 2008, issued in corresponding Chinese Patent Application No. 2003801104559 with English translation.

European Search Report dated Oct. 13, 2008; Application No. EP 08162077.

* cited by examiner

SEMICONDUCTOR DEVICE HAVING SIDE WALL SPACERS

CROSS REFERENCE TO RELATED APPLICATION

This application is a divisional of U.S. application Ser. No. 11/390,128 filed on Mar. 28, 2006, which is a continuation of PCT/JP2003/013582 filed on Oct. 23, 2003, the entire contents of which are incorporated herein by reference.

TECHNICAL FIELD

The present invention relates to a semiconductor device and a method for manufacturing the semiconductor device, and more particularly to a highly integrated semiconductor device having side wall spacers with a barrier function and a method of manufacturing the semiconductor device.

BACKGROUND ART

Since self-aligned contacts (SAC) are used recent years because of micro patterning requirements, side wall spacers of silicon nitride film are used. A silicon nitride film is an insulating film with a barrier function capable of functioning as an etching stopper having etching selectivity relative to an interlayer insulating film made of a silicon oxide film.

Device sizes are reduced due to high integration and miniaturization of MOSFETs. As the pn junction depth of source/drain regions becomes shallow, resistance values have a tendency of becoming large. In order to reduce the resistance of the source/drain regions, it is effective to form silicide layers on the source/drain regions.

FIGS. 7A to 7E are cross sectional views illustrating main processes of a conventional semiconductor device manufacture method.

As shown in FIG. 7A, an isolation trench is formed in the surface layer of a silicon substrate 11 by etching, and an insulator is embedded in the trench to form a shallow trench isolation (STI) 12. Local oxidation of silicon (LOCOS) may be used instead of STI. The surfaces of active regions defined by the isolation region are thermally oxidized to form gate oxide films 13. A polysilicon film is deposited on the gate oxide film 13 by chemical vapor deposition (CVD) and etched by using a resist pattern to form a gate electrode 14.

In etching the gate electrode 14, mixture gas of HBr and $Cl_2$ is used as etching gas to perform reactive etching which provides a high selection ratio between greatly different etching rates of silicon and the silicon oxide film. This etching provides an etching rate of the silicon oxide film very slower than that of silicon. Therefore, while polysilicon is etched, the gate oxide film 13 is etched only slightly and etching stops. Etching the polysilicon film is terminated in the state that the gate oxide film 13 is left on the surface of the active region. Damages are therefore hard to be formed in the surface layer of the active regions.

For example, n-type impurity ions are implanted by using the patterned gate electrode 14 as a mask to form extension regions 15 of source/drain regions. The extension regions 15 are formed to have a shallow junction depth in order to prevent punch-through.

As shown in FIG. 7B, a silicon nitride film is deposited by CVD, covering the gate electrode 14, and etched-back to remove the silicon nitride film on flat surfaces. Side wall spacers 16 of the silicon nitride film are left only on the side walls of the gate electrode 14. By using $CHF_3$ as main etching gas, etching can be stopped in the state that the gate oxide film 13 is left. Therefore, it is possible to prevent damages from being formed in the active region surface.

As shown in FIG. 7C, the gate oxide film 13 exposed on both sides of the side wall spacers is removed by using dilute hydrofluoric acid solution. The side wall spacers 16 of silicon nitride are not etched. In this case, not only the exposed gate oxide film 13 is removed, but also the gate oxide film 13 under the side wall spacers 16 are laterally etched and retracted toward the gate electrode direction. Therefore, the side wall spacers 16 have an overhang shape.

As shown in FIG. 7D, by using the gate electrode 14 and side wall spacers 16 as a mask, for example, n-type impurity ions are implanted to form source/drain regions 17 having deep junction depth. In the above manner, the fundamental structure of a MOSFET is formed.

As shown in FIG. 7E, after the source and drain regions 17 are formed, metal capable of being silicidated such as Ti and Co is deposited on the substrate surface by sputtering. After a primary silicidation reaction is performed and unreacted metal is removed, secondary silicidation reaction is performed to form silicide layers 18 on the source/drain region surfaces and gate electrode surface.

An interlayer insulating film 21 of silicon oxide or the like is deposited on the substrate surface by CVD, covering the gate electrode. Contact holes are formed through the interlayer insulating film 21, and a Ti layer, and a TiN layer or the like are formed by sputtering and a W layer is deposited by CVD to bury the metal layer in the contact holes. An unnecessary metal layer is removed to form conductive plugs 22.

During the dilute hydrofluoric acid solution process, undercuts are formed under the silicon nitride side wall spacers 16 as shown in FIG. 7C. If metal enters the undercuts in a later process and left unremoved, the remaining metal may cause a short circuit. If the silicide layer is formed in the undercuts, the silicide layer may increase its volume and impart a stress to the side wall spacers 16.

Publication JP-A-HEI-9-162396 teaches a method of forming source/drain regions and discloses a laminated side wall spacer structure having nitride film side wall spacers covering the side walls of a gate electrode and a gate insulating film and oxide film side wall spacers formed on the nitride side wall spacers, as the side wall spacers of the gate electrode. Since the oxide film side wall spacers are formed on the whole surfaces of the nitride film side wall spacers, it can be considered that undercuts described above are not formed. However, since the nitride film side wall spacers contact the substrate surfaces, it is inevitable that the nitride film side wall spacers impart stresses to the substrate. While the gate electrode pattern is dry-etched, if the gate insulating film is also removed, the substrate surface is exposed to etching and may be damaged.

A flash memory device is a non-volatile semiconductor memory device which stores information in the form of electric charges in the floating gate electrode. Since the flash memory device has a simple device structure, the flash memory device is suitable for structuring a large scale integrated circuit device.

Information write/erase of a flash memory device is performed by hot carrier injection into the floating gate electrode and carrier extraction by the Fowler-Nordheim tunneling effect. High voltage becomes necessary for such write/erase operations of a flash memory device so that a booster circuit for boosting a power source voltage is formed in a peripheral circuit. Transistors in the booster circuit are required to operate at high voltages.

Recent semiconductor integrated circuits provide a composite function by integrating a flash memory device and a high speed logic circuit on the same substrate. Transistors constituting the high speed logic circuit are required to operate at low voltages. For a high speed operation, it is desired to thin a gate insulating film even if leak current is generated. A circuit operating at a low power dissipation is required in some cases. It is desired to make the gate insulating film thick to some extent in order to reduce leak current for a low power dissipation. In order to meet these requirements, it is desired to form, on the same semiconductor substrate, transistors of a plurality of types having different gate insulating film thicknesses and operating at a plurality of power source voltages.

The retention characteristics of a flash memory cell depend on the charge retaining or holding characteristics of the floating gate electrode. In order to improve the retention characteristics, it is desired to cover the floating gate with an insulating film of good quality. Usually, the lower surface of the floating gate electrode made of a silicon film is covered with a tunneling insulating film, the upper surface thereof is covered with an ONO film, and a thermally oxidized film covers the side walls thereof. The surface of this structure is desired to be covered with a good quality silicon nitride film. The thermally oxidized film is an insulating film with a barrier function for preventing leakage of stored charges, and the silicon nitride film is an insulating film with a barrier function for shielding OH radicals and moisture entering from the external.

Publication JP-A-2003-23114 discloses a method of forming, on the same semiconductor substrate, flash memory cells, low voltage operation transistors and high voltage operation transistors. Side wall spacers are formed at the same time both on the side walls of laminated gate electrodes of flash memory cells and on the side walls of gate electrodes of other transistors.

FIGS. 8A to 8D schematically show an example of a semiconductor device manufacture method of forming at the same time, flash memory cells, low voltage operation transistors and high voltage operation transistors.

As shown in FIG. 8A, the surface of a silicon substrate 11 formed with an isolation region is thermally oxidized to form a tunneling oxide film 25. An amorphous silicon film 26 is deposited on the tunneling oxide film 25, the amorphous silicon film being used later for forming a floating gate. A so-called ONO film 27 constituted of an oxide film 27a, a nitride film 27b and an oxide film 27c is formed on the amorphous silicon film 26. The amorphous silicon film becomes a polysilicon film by later heat treatment.

By using a resist pattern, the ONO film 27 and silicon film 26 are patterned to form a floating gate of a flash memory and an ONO film on the floating gate. At this time, the ONO film and silicon film in the low and high voltage operation transistor areas are completely removed.

By covering the flash memory area with a resist mask, the tunneling oxide film formed on the surface of the transistor area is removed by dilute hydrofluoric acid solution. The resist pattern is removed, and the substrate surface is thermally oxidized to form a thick gate oxide film 13a for high voltage operation transistors.

The flash memory area and high voltage operation transistor area are covered with a resist mask, and the gate oxide film formed on the surface of the low voltage transistor area is removed. After the resist pattern is removed, a thin gate oxide film 13b for low voltage operation transistors is grown by thermal oxidation. In this manner, the thin oxide film and thick oxide film are formed in the transistor area. If gate oxide films having three or more kinds of different thickness are to be formed, similar processes are repeated to form first a thick gate oxide film and then thinner gate oxide films.

Thereafter, a polysilicon film 28 is deposited on the whole substrate surface, and patterned by using a resist mask to form a control gate electrode 28c and gate electrodes 28a and 28b in the transistor area. The surfaces of the silicon films 26 and 28 are thermally oxidized to form a thermally oxidized films 29. By using as a mask at least the gate electrodes formed in this manner, ion implantation for source/drain regions is performed. For example, n-type regions 31, 32 and 33 are formed in the flash memory cell area and extension regions 15 are formed in the transistor area.

As shown in FIG. 8B, a silicon nitride film is deposited on the whole substrate surface by low pressure (LP) CVD, and etched-back to leave side wall spacers 16 only on side walls of the gate electrodes and laminated gate electrode.

As shown in FIG. 8C, the flash memory cell area is covered with a photoresist pattern PR, and ions are implanted into the transistor area to form source/drain regions 17 having a deep junction depth. In this case, the high voltage transistor and low voltage transistor may be separated by resist masks to execute separate ion implantation processes in both the areas.

As shown in FIG. 8D, an interlayer insulating film 21 of silicon oxide or the like is deposited on the substrate formed with the gate electrodes and laminated gate electrode, and contact holes are formed through the interlayer insulating film. A conductive layer is buried in the contact holes, and an unnecessary portion thereof is removed to form conductive plugs 22.

In this manner, it becomes possible to form flash memory cells and transistors of a plurality of types having different gate insulating film thicknesses and different operation voltages.

It is desired for the flash memory cell to have the thermally oxidized film of good quality on the side walls of the laminated gate electrode, and the silicon nitride film 16 of good quality formed by LP-CVD on the thermally oxidized film. In order to form a dense and high quality silicon nitride film, it is desired to execute LP-CVD at a film forming temperature of, e.g., 700° C. or higher.

In the transistor area, the extension regions 15 having a shallow junction depth are already formed before the insulating film having a barrier function such as a silicon nitride film is formed by LP-CVD. As the extension regions are subjected to the heat treatment at 700° C. or higher, impurities are thermally diffused so that there is a possibility that the extension regions cannot retain a desired shape.

In a logic circuit, in order to lower the resistance of the source/drain regions, it is desired to form the silicide layers on the surface of silicon as shown in FIG. 7E. Before the silicide layer is formed, it is necessary to clean the substrate surface with dilute HF solution. In this case, as described in the manufacture processes shown in FIG. 7A to 7E, side-etched recesses are formed under the side wall spacers, forming overhangs. As the overhangs are formed, the overhangs may cause a short circuit and the like.

As above, as semiconductor elements of a plurality of types are formed on the same semiconductor substrate and the characteristics of each semiconductor element are to be optimized, unexpected disadvantages may be given to other semiconductor devices.

DISCLOSURE OF THE INVENTION

An object of the present invention is to provide a semiconductor device having side wall spacers made of insulating films having a barrier function and being free of disadvantages to be caused by forming the side wall spacers.

Another object of the present invention is to provide a semiconductor device integrating flash memory cells, low voltage operation transistors and high voltage operation transistors and being free of disadvantages to be caused by mixedly forming different types of transistors.

Still another object of the present invention is to provide a semiconductor device manufacture method suitable for manufacturing such semiconductor devices.

According to one aspect of the present invention, there is provided a semiconductor device comprising: a semiconductor substrate; a first gate oxide film formed on the semiconductor substrate; a first gate electrode formed on the first gate oxide film; first source/drain regions formed in the semiconductor substrate on both sides of the first gate electrode; and first laminated side wall spacers having two or more layers and formed on side walls of the first gate electrode, the first laminated side wall spacers including a nitride film as a layer other than an outermost layer, the outermost layer being made of an oxide film or an oxynitride film and having a bottom surface contacting the semiconductor substrate, the first gate oxide film or a side wall spacer layer other than the nitride film.

According to another aspect of the present invention, there is provided a method for manufacturing a semiconductor device comprising the steps of: (a) forming a gate insulating film on a semiconductor substrate; (b) forming a conductive film on the gate insulating film; (c) etching the conductive film to form a gate electrode and expose the gate insulating film; (d) depositing a first insulating film having an etching selectivity relative to the gate insulating film, on a whole surface of the semiconductor substrate, and leaving first side wall spacer layers on side walls of the gate electrode by anisotropic etching; (e) etching the gate insulating film to expose a surface of the semiconductor substrate; (f) depositing a second insulating film on the whole surface of the semiconductor substrate, and leaving second side wall spacers on side walls of the first side wall spacers by anisotropic etching; (g) implanting ions via the first and second side wall spacers to form source/drain regions; (h) exposing the surface of the semiconductor substrate by using dilute hydrofluoric acid solution; and (i) forming a silicide layer on the exposed semiconductor substrate surface.

BEST MODE FOR CARRYING OUT THE INVENTION

Embodiments of the present invention will be described with reference to the drawings. FIGS. 1A to 1E are cross sectional views schematically illustrating a manufacture method for a semiconductor device according to the first embodiment of the present invention.

Figure 1A:
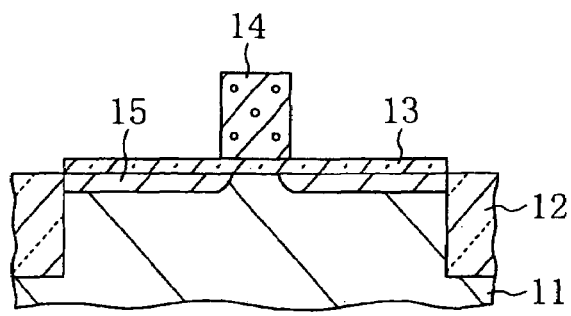
FIGS. 1A to 1E are cross sectional views of a semiconductor substrate schematically illustrating a manufacture method for a semiconductor device according to a first embodiment of the present invention.

As shown in FIG. 1A, an isolation trench is formed in the surface layer of, e.g., a p-type semiconductor substrate 11, an insulating film is buried in the trench, and an unnecessary portion of the insulating film is removed by chemical mechanical polishing (CMP) to form an STI type isolation region 12. The surface of each active region defined by the isolation region 12 is thermally oxidized at 800° C. to 1100° C. to form a gate insulating film 13. A polysilicon film is deposited on the surface of the semiconductor substrate, covering the gate oxide film 13. By using a photoresist pattern as a mask, the polysilicon film is etched to pattern a gate electrode 14.

In this case, mixture gas of HBr and $Cl_2$ is used as etching gas to perform reactive ion etching (RIE) having a high selectivity with considerably different etching rates between silicon and the silicon oxide film. This etching has a very slow etching rate of the silicon oxide film relative to Si. Therefore, while polysilicon is etched, etching can be stopped by only slightly etching the gate oxide film 13. The resist pattern is thereafter removed. By using the patterned gate electrode as a mask, for example, n-type impurity ions are implanted shallowly to form extension regions 15 of source/drain regions.

Figure 1B:
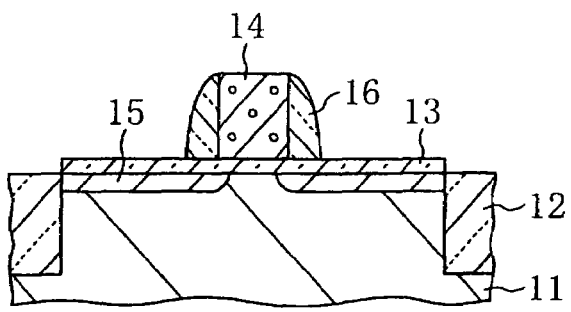

As shown in FIG. 1B, a silicon nitride film is deposited covering the gate electrode, and thereafter etched back to leave side wall spacers 16 of the silicon nitride film only on the side walls of the gate electrode 14. This etching is performed by reactive ion etching (RIE) using mainly $CHF_3$ as etching gas to leave the gate oxide film 13. If damages to the substrate poses no problem, the gate oxide film 13 may be etched and removed.

Figure 1C:
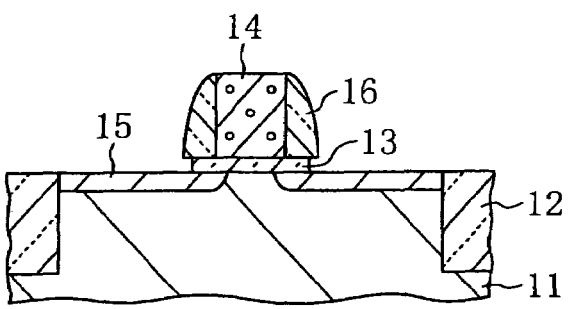

As shown in FIG. 1C, in order to remove the left gate oxide film 13 or a native or natural noxide film formed on the substrate surface if the gate oxide film is already removed, silicon oxide is isotropically etched. Irotropic etching is an etching method with smaller damages, and can be performed by using dilute hydrofluoric acid solution or downstream dry etching. Since isotropic etching progresses also along a lateral direction, the gate insulating film 13 under the side wall spacers 16 is retracted. In this manner, undercuts are formed under the side wall spacers 16.

Figure 1D:
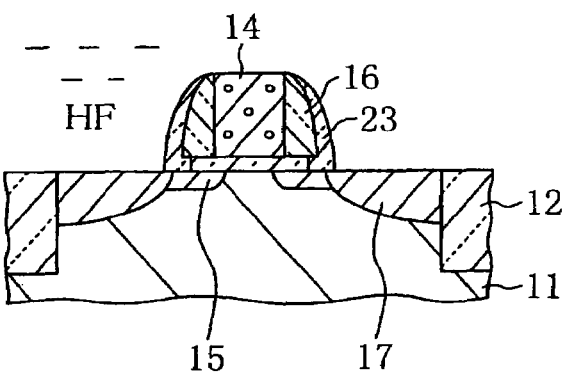

As shown in FIG. 1D, a silicon oxide film 23 is deposited on the whole surface of the substrate by using tetraethoxysilane (TEOS). The silicon oxide film 23 is deposited on the whole surface of the substrate, burying also the undercuts. Anisotropic etching is performed by RIE using mainly $CF_4$ as etching gas. The silicon oxide film on a flat surface is removed to form side wall spacers 23 of the silicon oxide film which covers the side surfaces of the side wall spacers 16 of the silicon nitride film and burying the undercuts.

Prior to a silicidation process, the silicon oxide films on the surface of the semiconductor substrate 11 and on the surface of the gate electrode 14 are removed with dilute hydrofluoric acid solution to expose clean surfaces. Since the whole side surfaces of the side wall spacers are made of the TEOS silicon oxide film, an etching rate is uniform and undercuts will not be formed. It is therefore possible to prevent an unexpected short circuit and strain.

Figure 1E:
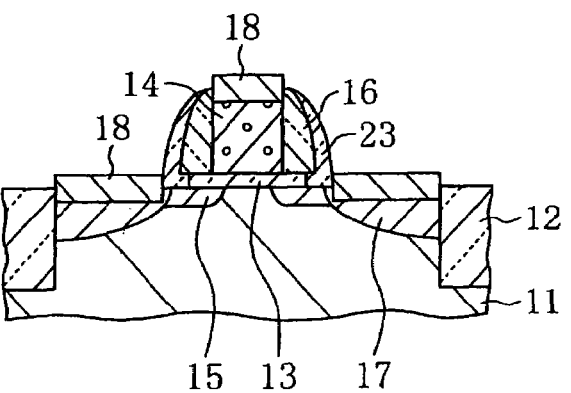

As shown in FIG. 1E, a metal layer capable of being silicidated such as a Co layer and a Ti layer is formed on the surface of the semiconductor substrate to a thickness of, e.g., about 30 nm by sputtering. A primary silicidation reaction is performed by rapid thermal annealing (RTA), for example, 30 seconds at 550° C. to conduct the primary silicidation reaction between Si and metal. After an unreacted metal layer is removed, a secondary silicidation reaction is performed by RTA, for example, 30 seconds at 800° C. to form silicide layers 18.

Figure 7A:
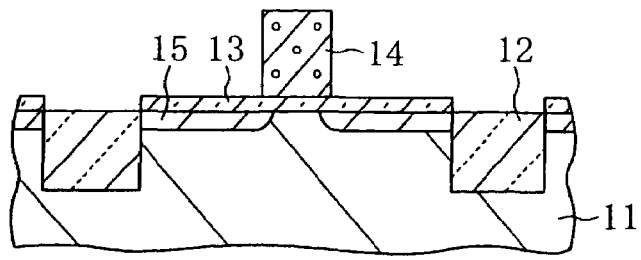
FIGS. 7A to 7E are cross sectional views of a semiconductor substrate schematically illustrating a manufacture method for a semiconductor device according to prior art.
Figure 7B:
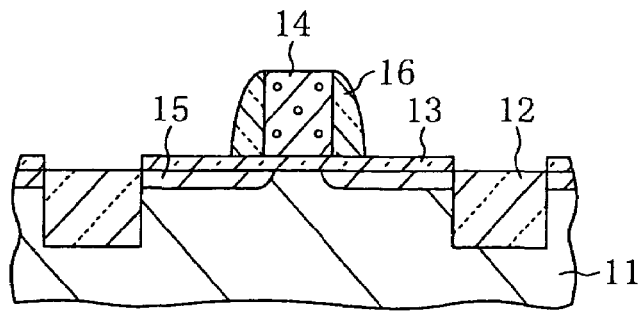
Figure 7C:
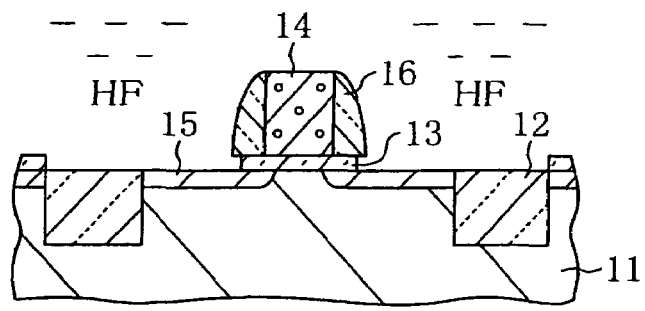
Figure 7D:
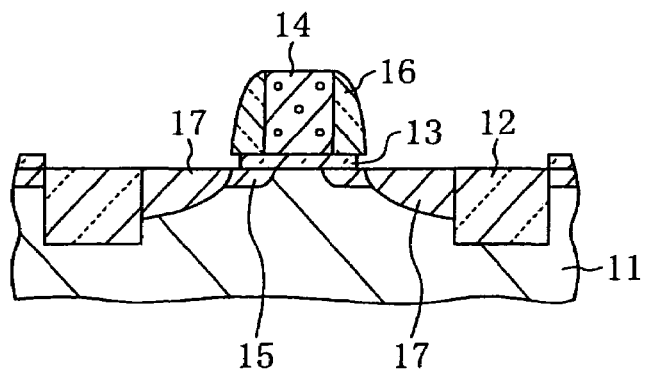
Figure 7E:
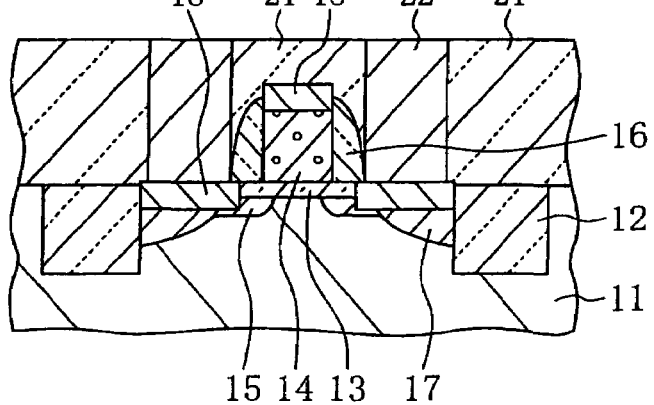
Figure 8A:
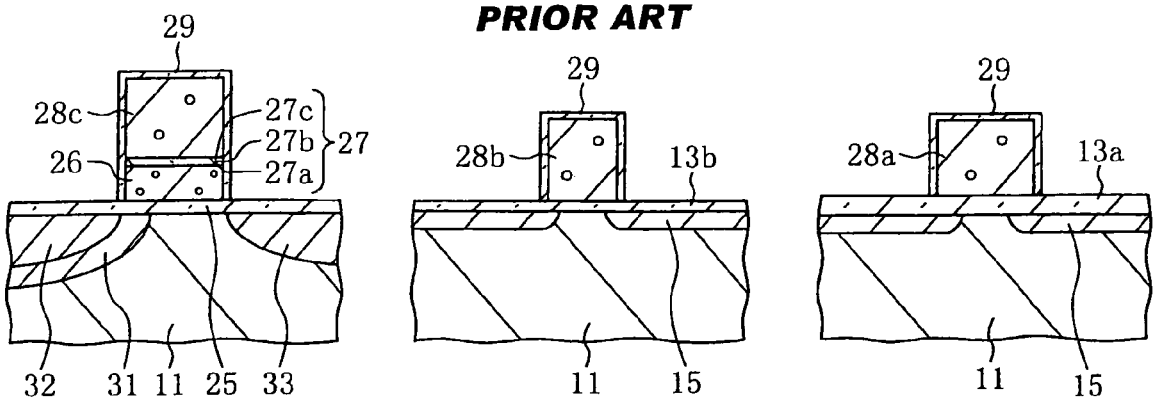
FIGS. 8A to 8D are cross sectional views of a semiconductor substrate schematically illustrating a manufacture method for a semiconductor device mixedly mounting flash memory cells and other transistors according to prior art.
Figure 8B:
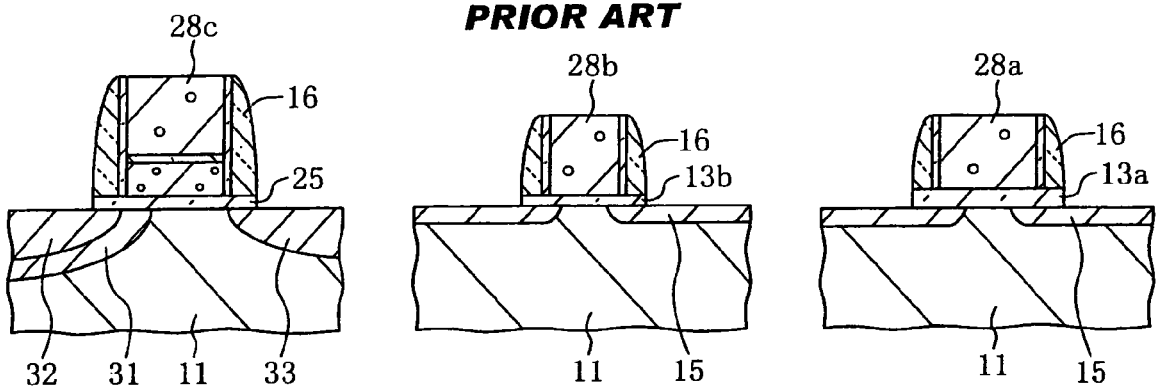
Figure 8C:
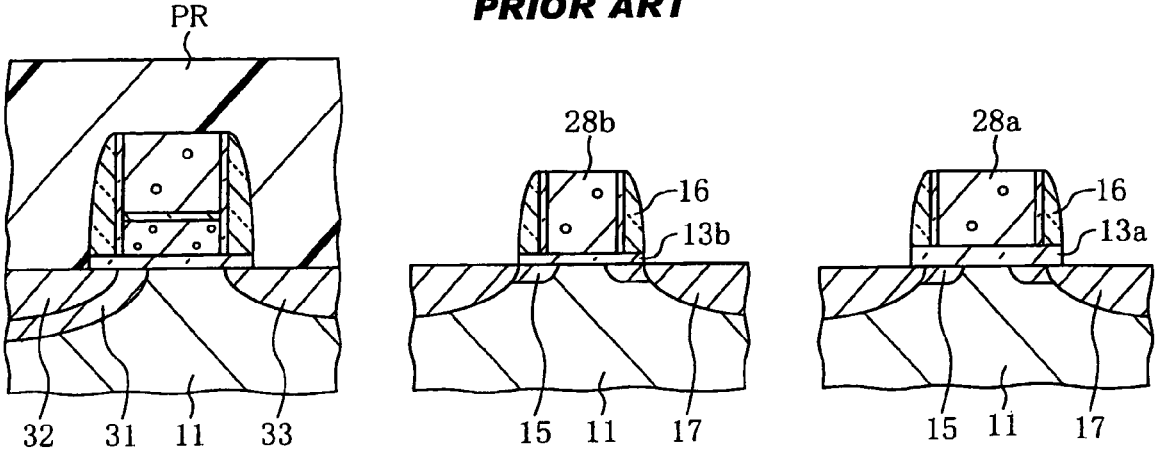
Figure 8D:
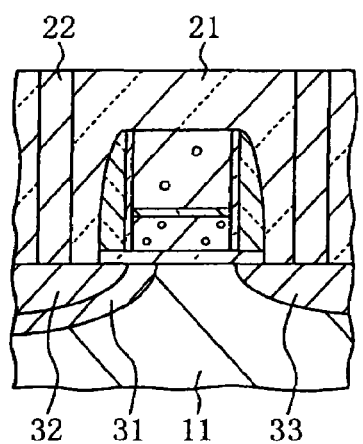
Figure 8D:
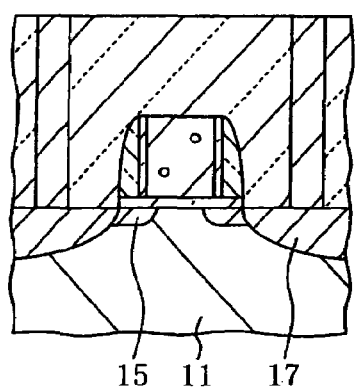
Figure 8D:
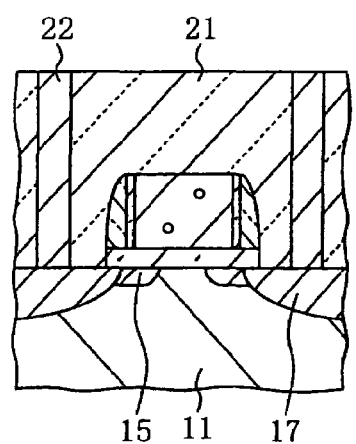

Since the silicide layers can be formed without undercuts and the side wall spacers including the silicon nitride films are formed, the self-aligned contact (SAC) process such as shown in FIG. 7E can be executed.

FIGS. 2A to 2E are cross sectional views schematically illustrating a semiconductor device manufacture method according to the second embodiment of the present invention.

Figure 2A:
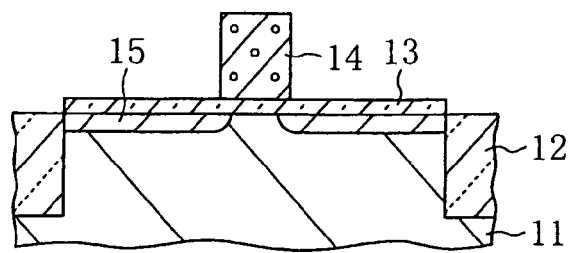
FIGS. 2A to 2E are cross sectional views of a semiconductor substrate schematically illustrating a manufacture method for a semiconductor device according to a second embodiment of the present invention.
Figure 2B:
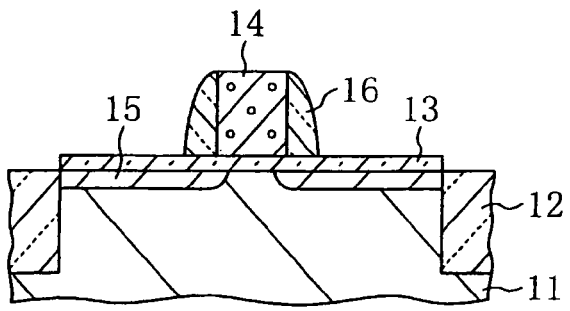

FIGS. 2A and 2B show the same structures as those shown in FIGS. 1A and 1B, and these structures can be manufactured by the same processes.

Figure 2C:
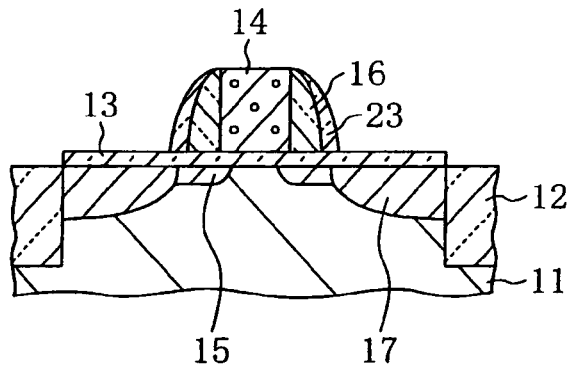

As shown in FIG. 2C, side wall spacers 23 of TEOS silicon oxide are formed covering the side wall spacers 16 of silicon nitride. The TEOS silicon oxide film has an etching rate faster than that of the thermally oxidized film. While the side wall spacers 23 are formed, control etching is performed to leave the gate oxide film 13.

Figure 2D:
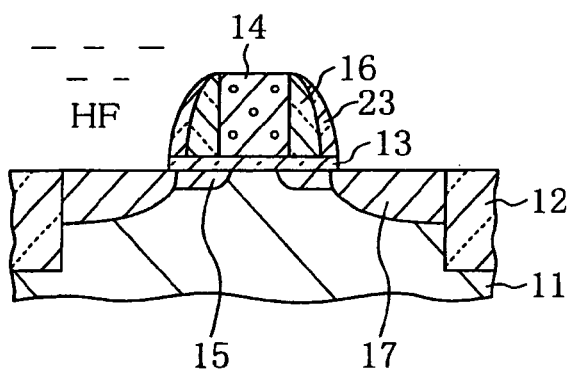

As shown in FIG. 2D, for a silicidation reaction, the surfaces of the substrate 11 and gate electrode 14 are exposed by using dilute hydrofluoric acid solution. In this etching, the TEOS silicon oxide film 23 has an etching rate faster than that of the thermally oxidized gate oxide film 13. Therefore, when the gate oxide film 13 and TEOS silicon oxide film 23 are etched at the same time, etching the gate oxide film 13 is delayed so that undercuts will not be formed even if projections are formed.

Figure 2E:
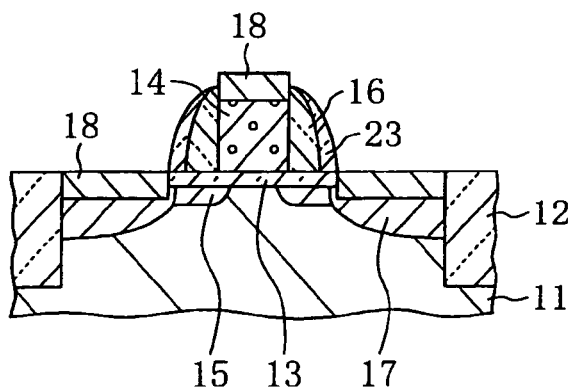

As shown in FIG. 2E, silicide layers 18 are formed on the exposed silicon surfaces similar to the first embodiment.

According to this embodiment, the gate oxide film is exposed in the area lower than the side wall spacers. However, since the outermost layers of the side wall spacers is made of the silicon oxide film having an etching rate faster than that of the gate oxide film, undercuts will not be formed. The side wall spacers contain the silicon nitride films so that the SAC process can be executed. The silicon nitride film does not contact the substrate surface so that excessive strain is prevented from being applied.

FIGS. 3A to 3E are cross sectional views schematically illustrating a semiconductor device manufacture method according to the third embodiment of the present invention.

Figure 3A:
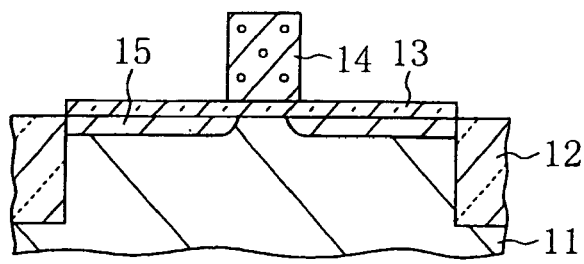
FIGS. 3A to 3E are cross sectional views of a semiconductor substrate schematically illustrating a manufacture method for a semiconductor device according to a third embodiment of the present invention.

FIG. 3A shows the same structure as that shown in FIG. 1A, and this structure can be manufactured by the same process.

Figure 3B:
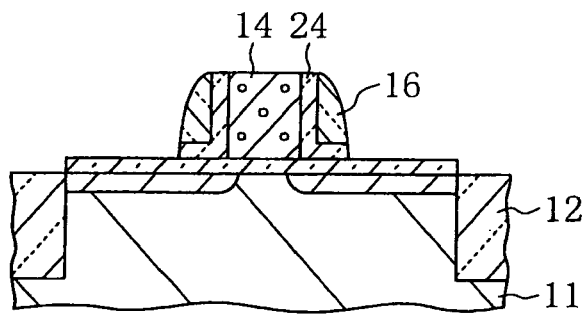

As shown in FIG. 3B, a silicon oxide film made of TEOS and a silicon nitride film are successively deposited covering the gate electrode 14, etched back to form laminated side wall spacers made of silicon oxide films 24 covering the side walls of the gate electrode 14 and silicon nitride films 16 on the silicon oxide films 24. Instead of the TEOS silicon oxide film, a silicon oxide film formed by thermal oxidation may be used. In forming the side wall spacers, the silicon nitride film is etched by using mainly $CHF_3$ gas as etching gas, and the silicon oxide film is etched mainly by using $CF_4$ gas as etching gas. If the gate oxide film 2 is to be left, control etching with limited time is performed.

Figure 3C:
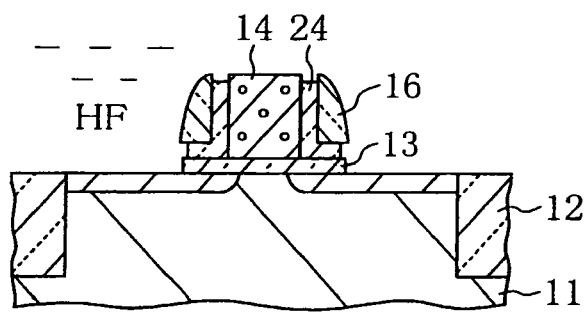

As shown in FIG. 3C, the gate oxide film or a native or natural oxide film on the silicon surface is removed by using dilute hydrofluoric acid solution to expose the surface of the active region. Since the silicon oxide film on the substrate surface, the gate oxide film 13 and the silicon oxide films 24 of the side wall spacers are etched, undercuts are formed under the silicon nitride side wall spacers 16.

Figure 3D:
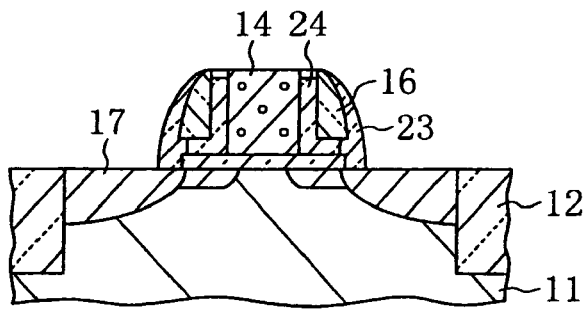

As shown in FIG. 3D, a silicon oxide film of TEOS is deposited and etched back to form side wall spacers 23. The side wall spacers 23 bury the undercuts under the side wall spacers of the silicon nitride film to form an outer surface without undercuts.

Figure 3E:
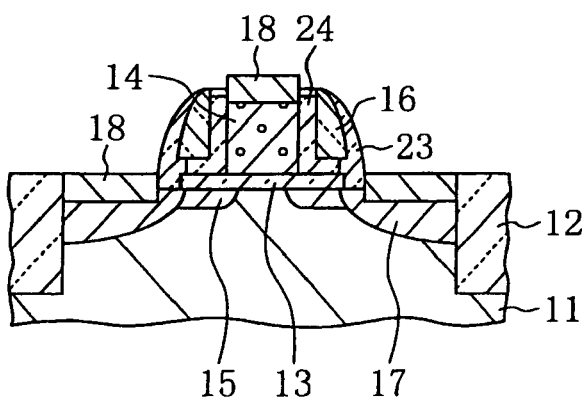

As shown in FIG. 3E, similar to the above-described embodiments, silicide layers 18 are formed on the exposed silicon surfaces.

According to this embodiment, the side wall spacer is made of three layers including the silicon oxide film, silicon nitride film and silicon oxide film and the outermost side wall spacers 23 reach the substrate surfaces. The dilute hydrofluoric acid washing process before the silicide layers are formed can therefore prevent undercuts from being formed. Since the side wall spacers contain the silicon nitride films, the SAC process can be executed. The silicon nitride film does not contact the substrate surface, so that excessive strain is prevented from being applied.

FIGS. 4A to 4E are cross sectional views schematically illustrating a semiconductor device manufacture method according to the fourth embodiment of the present invention.

Figure 4A:
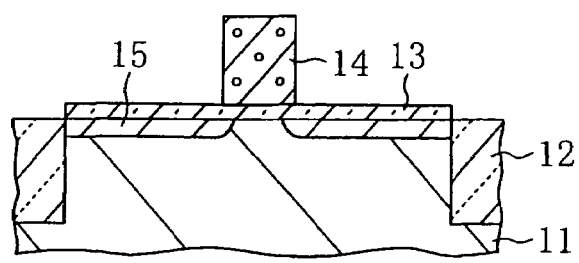
FIGS. 4A to 4E are cross sectional views of a semiconductor substrate schematically illustrating a manufacture method for a semiconductor device according to a fourth embodiment of the present invention.

FIG. 4A shows the same structure as that shown in FIG. 1A, and this structure can be manufactured by the same process.

Figure 4B:
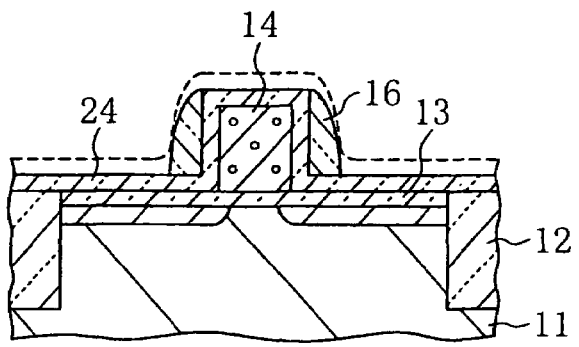

As shown in FIG. 4B, similar to the third embodiment, a lamination of a silicon oxide film 24 and a silicon nitride film 16 is deposited covering the gate electrode 14, and the silicon nitride film 16 is etched back. By performing RIE with a proper selectivity using mainly $CHF_3$ as etching gas, side wall spacers of the silicon nitride films 16 are formed and the underlying silicon oxide films 24 are left.

Figure 4C:
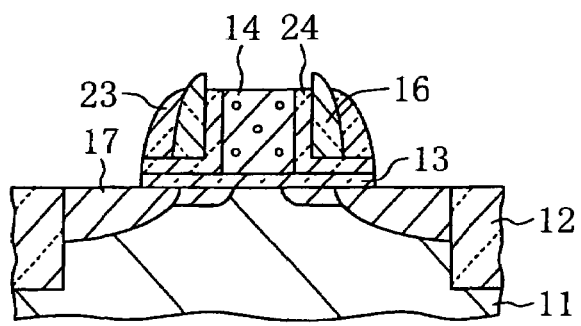

As shown in FIG. 4C, a silicon oxide film 23 is deposited on the whole substrate surface, and etched back to remove the silicon oxide films 23 and 24 on the flat surface. Side wall spacers are therefore formed on the side walls of the gate electrode 14, each having a three-layer lamination structure of the silicon oxide film 24, silicon nitride film 16 and silicon oxide film 23. The first silicon oxide films 24 in a bent shape or L-shape are formed on the upper surface of the gate oxide film 13 and on the side walls of the gate electrodes 14, and side wall spacers made of a lamination of the silicon nitride films 16 and silicon oxide films 23 are formed on the bent first silicon oxide films. At this stage, ion implantation is performed to form source/drain regions 17.

Figure 4D:
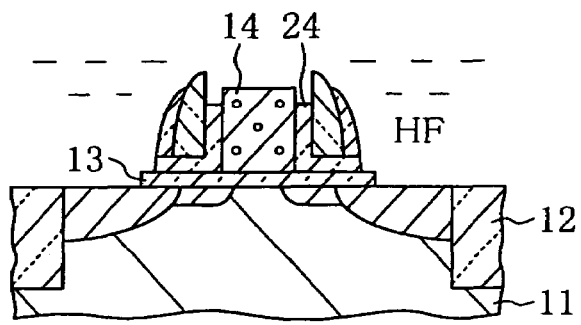

As shown in FIG. 4D, a gate oxide film or a natural or naïve oxide film existing on the silicon substrate surface is removed to expose a clean substrate surface. Although the side surfaces of the gate oxide film are exposed, the gate oxide film has an etching rate slower than that of the silicon oxide film 23 and undercuts will not be formed.

Figure 4E:
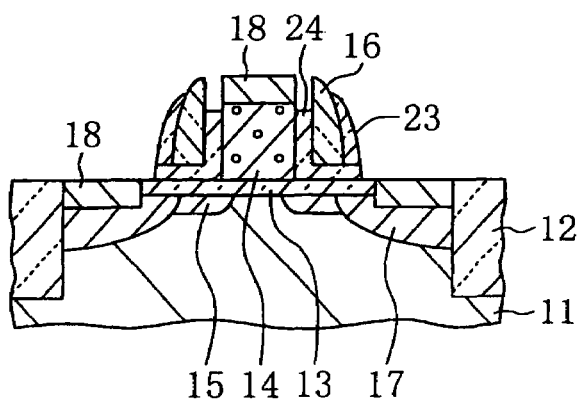

As shown in FIG. 4E, a silicidation reaction like that shown in FIG. 1E is performed to form silicide layers 18 on exposed silicon surfaces. The silicide layers of low resistance are formed on the silicon surfaces, without undercuts so that the resistance of the electrode regions can be lowered.

In this embodiment, although the gate oxide film and the silicon oxide on the gate oxide film are exposed on the side planes of the side wall spacers, the etching rate of the gate oxide film is slower than that of the upper silicon oxide film and the side etching is suppressed so that undercuts are prevented from being formed. Since the side wall spacers contain the silicon nitride film, i.e., an insulating film having a barrier function, the SAC process of etching the interlayer insulating film can be executed. The silicon nitride film does not reach the substrate surface so that excessive strain can be prevented from being applied.

In the following, description will be made on the embodiment of a semiconductor device mixedly mounting a flash memory, a memory for a logic circuit, flash memory driving high voltage transistors and the like.

Figure 5A:
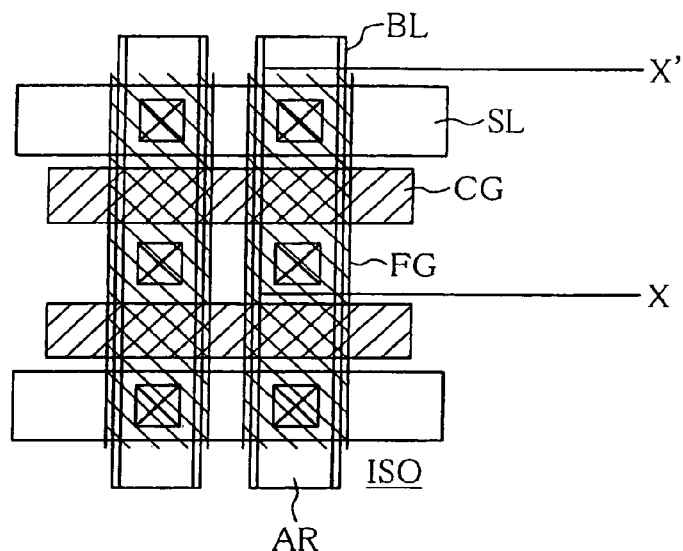
FIGS. 5A to 5D are plan views and equivalent circuit diagrams schematically showing the structures of flash memory cells.
Figure 5B:
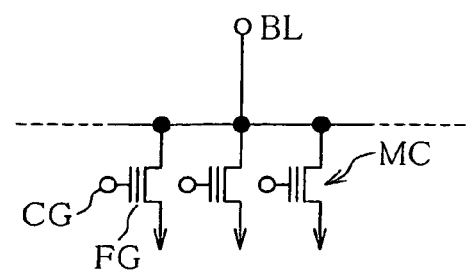

FIGS. 5A and 5B are a plan view and an equivalent circuit diagram showing the structure of a NOR type flash memory. As shown in FIG. 5A, an isolation region ISO is formed in a semiconductor substrate to define active regions AR. A tunneling oxide film is formed on the active region AR, and an amorphous silicon film as a floating gate and an ONO film are deposited on the whole substrate surface and patterned in conformity with the shape of the active region AR. Thereafter, a polysilicon film as a control gate is deposited and patterned along a direction perpendicular to the floating gate, and the exposed underlying ONO film and floating gate are patterned. Ion implantation for source/drain regions is performed to form a fundamental structure of a flash memory. A source line SL is formed along a direction crossing the active region AR, and connected to source regions. A bit line BL is formed on the interlayer insulating film along a direction along the active region, and connected to drain regions.

As shown in FIG. 5B, each flash memory cell MC having the floating gate FG and control gate CG is connected to a common bit line BL and a separate source line so that each flash memory can be read independently.

Figure 5C:
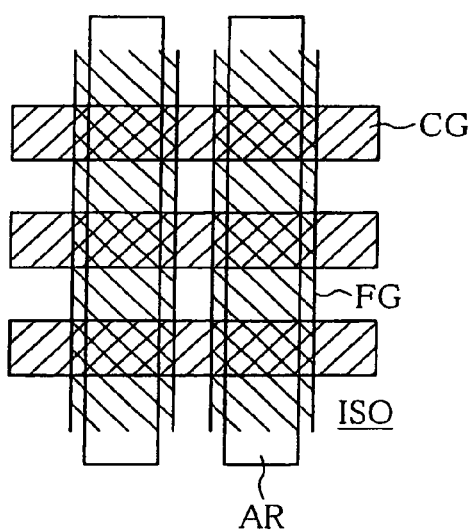
Figure 5D:
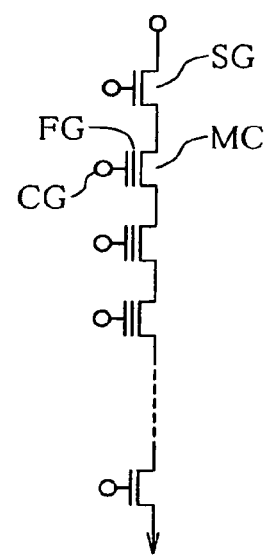

FIGS. 5C and 5D is a plane view and an equivalent circuit diagram showing the structure of a NAND type flash memory. As shown in FIG. 5C, an isolation region ISO is formed to define active regions AR along a vertical direction in FIG. 5C similar to FIG. 5A. A floating gate FG is formed along a direction along the active region AR, and a control gate CG is formed along a direction crossing the direction of the floating gate, and patterned together with the underlying floating gate FG.

As shown in FIG. 5D, a plurality of flash memory cells MC are connected in series and connected to a read circuit via a select gate SG. An on-voltage is applied to the select gate SG, a read voltage for turning on/off a cell in accordance with accumulated charges is applied to the cell, and an on-voltage is applied to other flash memory cells MC to forcibly turn on these cells. In this manner, a storage state of a memory cell can be read via a plurality of transistors.

In the following, description will be made on a flash memory cell with reference to the cross sectional views taken along line X-X' in FIG. 5A by way of example. It is obvious that the NAND type flash memory can be manufactured by similar processes.

Figure 6A:
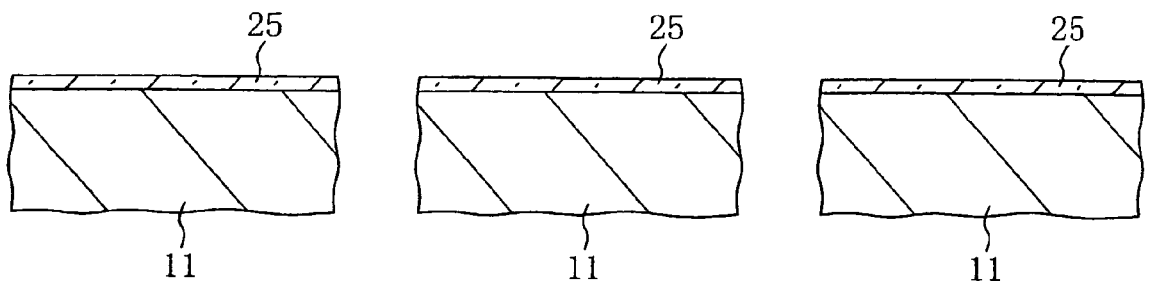
FIGS. 6A to 6U are cross sectional views of a semiconductor device schematically illustrating manufacture processes for a semiconductor device mixedly mounting flash memory cells and other transistors according to a fifth embodiment of the present invention.

As shown in FIG. 6A, a tunneling oxide film 25 having a thickness of 8 nm to 10 nm is formed on the surface of an active region of a semiconductor substrate 11 by thermal oxidation at 800° C. to 1000° C. In the drawings, the left area is a memory area in which a flash memory is formed, the central area is a logic circuit area in which low voltage operation transistors are formed, and the right area is a peripheral circuit area in which high voltage operation transistors are formed. A plurality of types of transistors having different gate oxide film thicknesses may be formed in the logic circuit area. Each area is defined by an isolation region such as STI. Although the tunneling oxide film is not necessary to be formed in the transistor area, the tunneling oxide film is formed at the same time when the substrate surface is subjected to thermal oxidation.

Figure 6B:
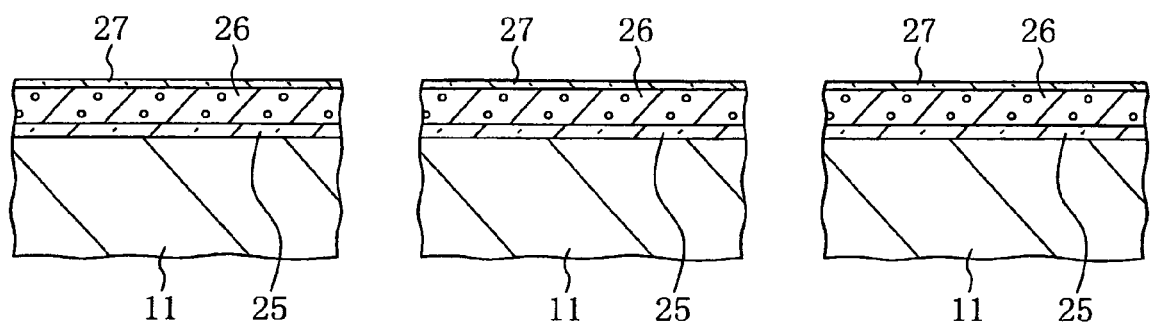

As shown in FIG. 6B, a doped amorphous silicon film having a thickness of 80 nm to 120 nm and a P concentration of about 5E19 ($5\times10^{19}$) cm$^{-3}$ is deposited on the tunneling oxide film 25 by CVD at about 500° C., and an ONO film 27 is formed on the doped amorphous silicon film. The doped amorphous silicon film is changed to a polysilicon film at a later heat treatment.

Figure 6C:
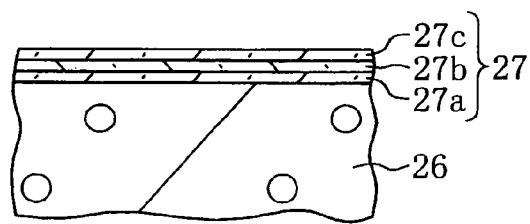

As shown in FIG. 6C, the ONO film is made of a lamination of a silicon oxide film 27a, a silicon nitride film 27b and a silicon oxide film 27c. First, the silicon oxide film 27a having a thickness of 5 nm to 10 nm is deposited on the amorphous silicon film 27 by high temperature CVD at a substrate temperature of 750° C. or higher, e.g., 800° C. The silicon nitride film 27b having a thickness of 5 nm to 10 nm is formed on the silicon oxide film 27a by low pressure CVD at a temperature of, e.g., 700° C. or higher. The surface of the silicon nitride film 27b is thermally oxidized at 950° C. to form the thermally oxidized silicon film 27c having a thickness of 3 nm to 10 nm.

The ONO film 27 formed in this manner has an excellent leak current preventive function. Although a film forming temperature of 700° C. or higher is adopted, this poses no problem because diffusion regions are still not formed in the transistor area.

Figure 6D:
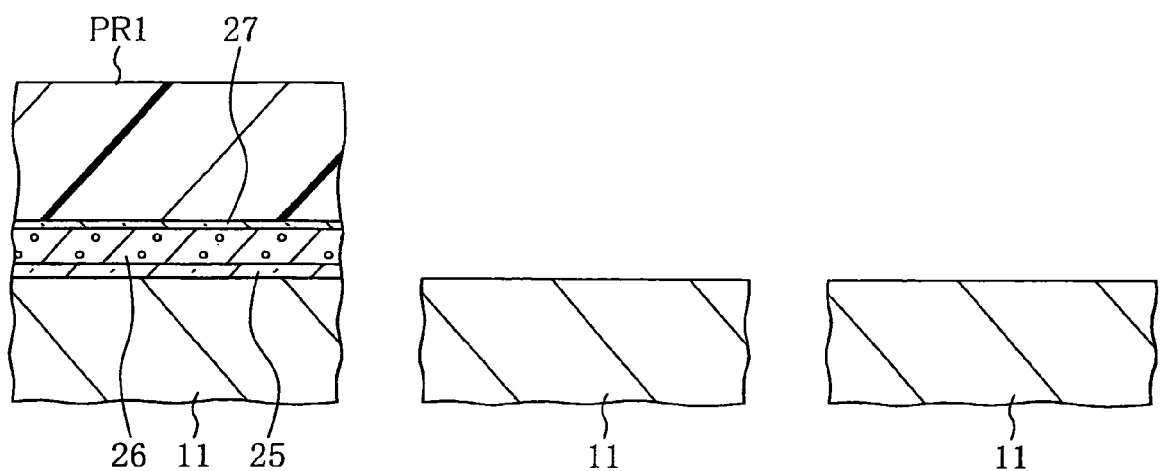

As shown in FIG. 6D, after the flash memory area is covered with a resist pattern PR1, the ONO film 27, silicon film 26 and tunneling oxide film 25 in the low and high voltage operation transistor areas are removed. These films on the isolation region are also removed. In order not to damage the substrate surface, the tunneling oxide film 25 is removed by wet etching using dilute HF solution.

Figure 6E:
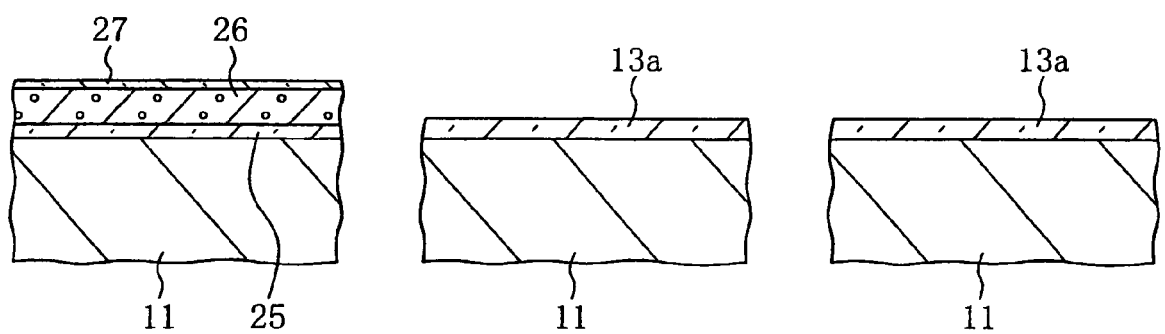

As shown in FIG. 6E, a silicon oxide film 13a is formed on the surface of the substrate 11 by thermal oxidation at 800° C. to 1100° C., the film 13a having a thickness of 10 nm to 50 nm suitable for a gate oxide film of a high voltage transistor. A similar silicon oxide film is also formed in the low voltage operation transistor area. Oxidation will not progress in the flash memory cell area because it is covered with the ONO film 27.

Figure 6F:
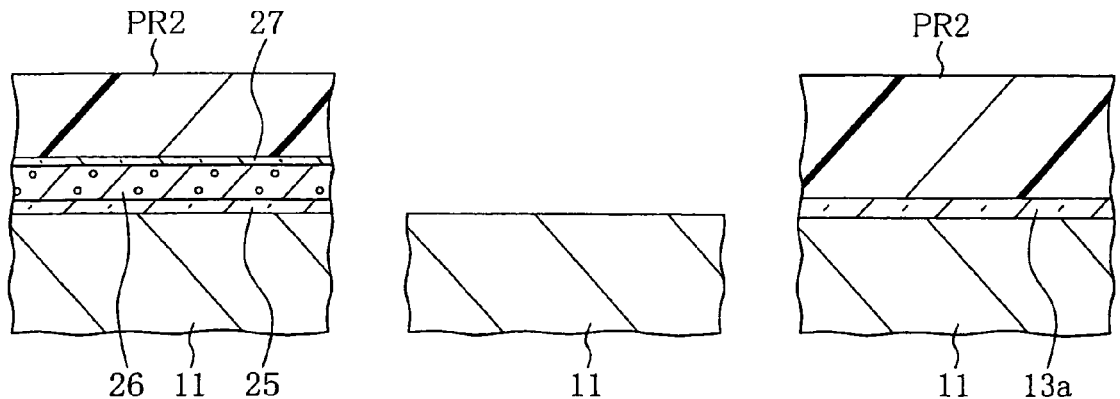

As shown in FIG. 6F, a resist mask PR2 is formed covering the flash memory cell area and high voltage operation transistor area, and the silicon oxide film 13a in the low voltage operation transistor area is removed by using dilute hydrofluoric acid solution.

Figure 6G:
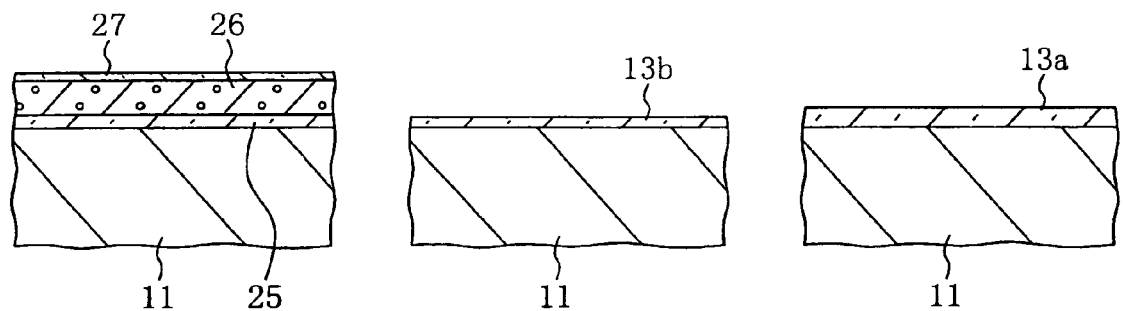

As shown in FIG. 6G, a gate oxide film 13b having a thickness of 1 nm to 10 nm is formed on the surface of the low voltage operation transistor area by thermal oxidation at 800° C. to 1100° C. In this manner, a thin gate oxide film is formed in the low voltage operation transistor area and a thick gate oxide film is formed in the high voltage operation transistor area. The gate oxide films of transistors may by made of silicon oxynitride instead of silicon oxide.

Figure 6H:
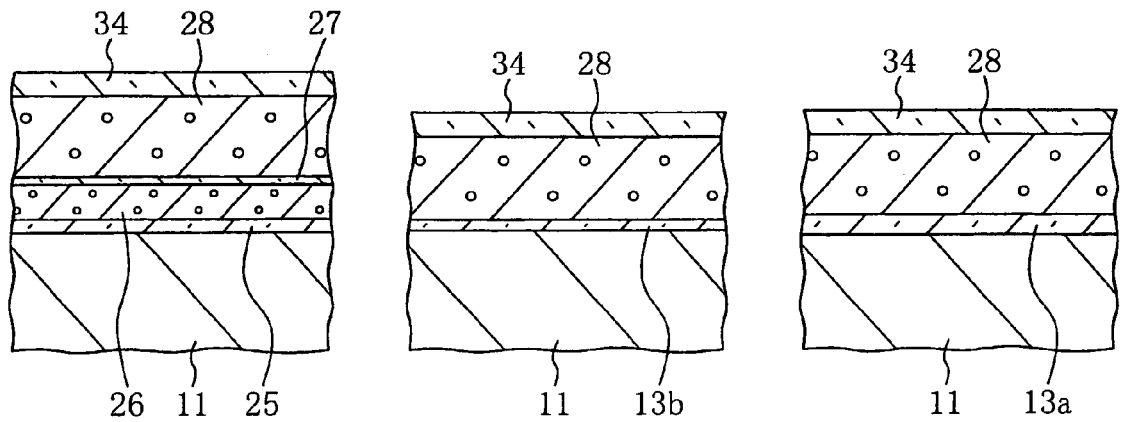

As shown in FIG. 6H, a polysilicon film 28 is deposited on the substrate surface to a thickness of 80 nm to 250 nm by CVD at a substrate temperature of, e.g., 620° C. This polysilicon film 28 is patterned in a later process to form a control gate electrode of the flash memory cell and a gate electrode in the transistor area.

A silicon nitride film 34 having a thickness of 10 nm to 25 nm is formed on the polysilicon film 28 by plasma CVD at a substrate temperature of, e.g., 400° C. A thermal silicon nitride film or a silicon oxynitride film by plasma CVD may be formed. The silicon nitride film is not necessary to be highly dense and have a high quality, if it functions as an etch stopper and a mask for thermal oxidation and ion implantation.

Figure 6I:
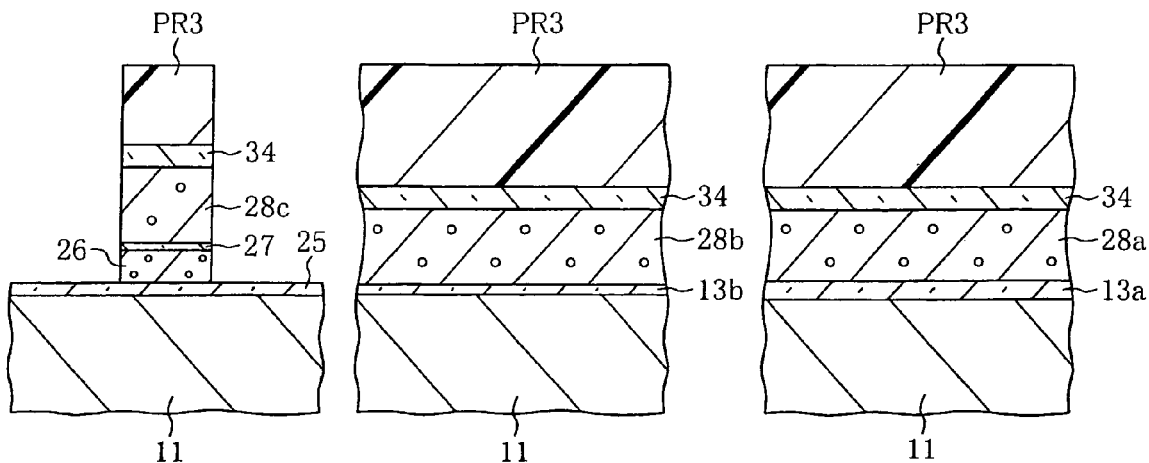

As shown in FIG. 6I, a resist pattern PR3 is formed on the silicon nitride film 34, having a laminated gate structure pattern of the flash memory cell and covering the low and high voltage operation transistor areas. Etched by using this resist pattern PR3 as a mask are the plasma silicon nitride film 34, polysilicon film 28, ONO film 27 and silicon film 26. Patterned in the flash memory cell area are the floating gate electrode 26 of the silicon film, ONO film 27, control gate electrode 28c and plasma silicon nitride film 34. The resist pattern PR3 is thereafter removed.

Figure 6J:
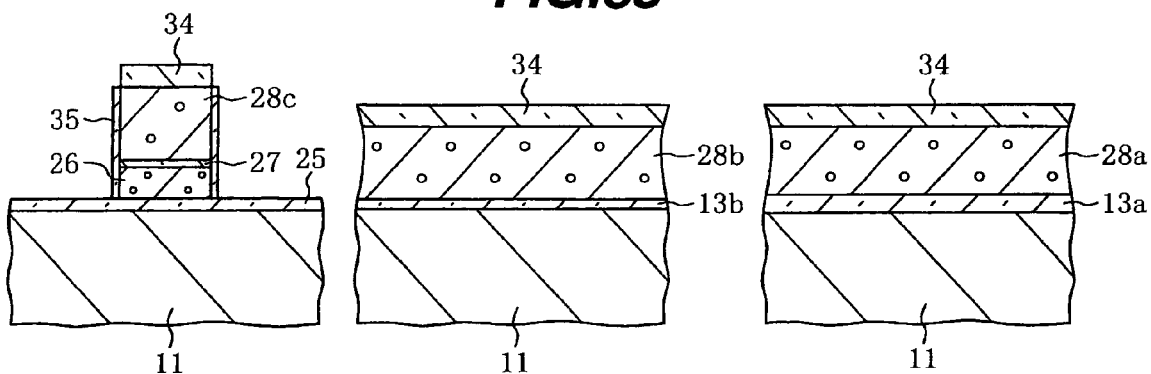

As shown in FIG. 6J, a protective oxide film 35 having a thickness of 1 nm to 5 nm is formed on the side planes of the silicon film of the flash memory cell by thermal oxidation at 800° C. to 900° C. The thermally oxidized film is an insulating film having a high barrier function relative to carrier leak. Thermal oxidation will not progress in the low and high voltage operation transistor areas because the silicon nitride film 34 covers the polysilicon film 28.

Figure 6K:
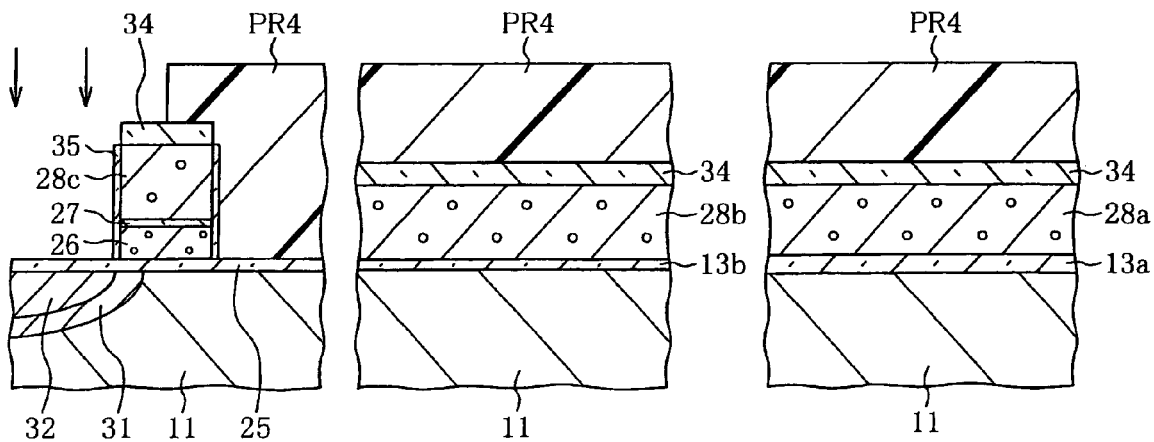

As shown in FIG. 6K, a resist pattern PR4 is formed covering one side of the gate electrode of the flash memory cell and the low and high voltage operation transistor areas. For example, P$^+$ ions are implanted into the region exposed in the opening of the resist pattern PR4 under the conditions of an acceleration energy of 50 keV to 80 keV and a dose of $1 \times 10^{14}$ cm$^{-2}$ to $5 \times 10^{14}$ cm$^{-2}$, to thereby form a n-type drain region 31. Further, As$^+$ ions are implanted to form a diffusion region 32 under the conditions of an acceleration energy of 30 keV to 50 keV and a dose of $1 \times 10^{15}$ cm$^{-2}$ to $6 \times 10^{15}$ cm$^{-2}$. The resist pattern PR4 is thereafter removed.

Figure 6L:
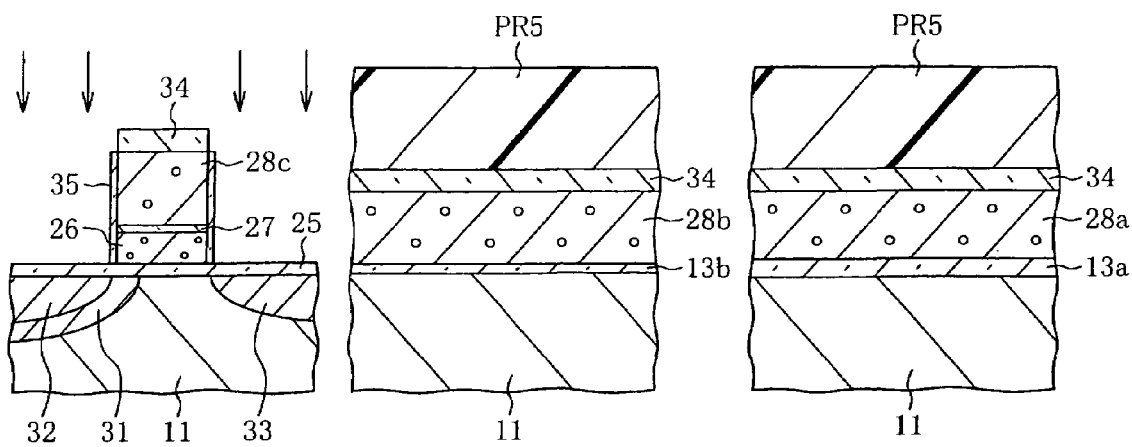

As shown in FIG. 6L, a resist pattern PR5 is formed covering the low and high voltage operation transistor areas. As$^+$ ions are implanted into the flash memory area under the conditions of an acceleration energy of 20 keV to 60 keV and a dose of $5 \times 10^{14}$ cm$^{-2}$ to $3 \times 10^{15}$ cm$^{-2}$ to raise the concentration of the diffusion region 32 and form a source diffusion region 33 on the other side. The resist pattern PR5 is thereafter removed.

Figure 6M:
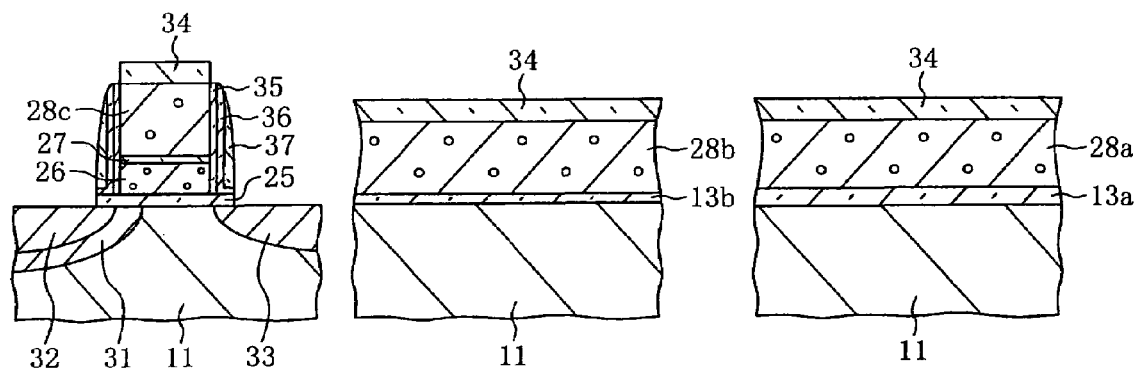

As shown in FIG. 6M, a TEOS silicon oxide film 36 is deposited at a substrate temperature of 600° C., and then a silicon nitride film 37 is deposited by low pressure (LP) CVD at 0.8 torr and a substrate temperature of 800°. The silicon nitride film formed by LP-CVD is a highly dense and high quality insulating film having a high barrier function relative to moisture and SiH bases. The LP-CVD silicon nitride film and TEOS silicon oxide film are removed by anisotropic etching using mainly CHF$_3$ as etching gas and anisotropic etching using mainly CF$_4$ as etching gas, respectively, to form side wall spacers made of a lamination of the silicon oxide film 36 and silicon nitride film 37 on the side walls of the laminated gate electrode. The TEOS silicon oxide film 36 may be omitted.

Figure 6N:
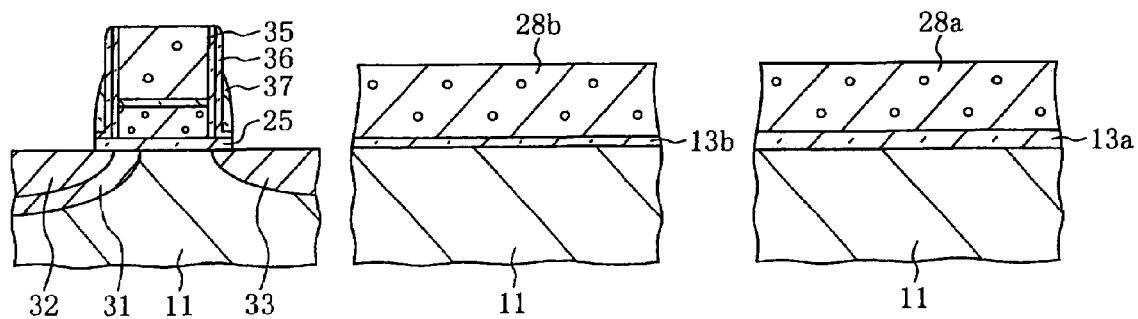

As shown in FIG. 6N, anisotropic etching is further performed by using mainly CF$_4$ as etching gas to etch the silicon nitride film 34. The upper portion of the side wall spacers 37 of silicon nitride is also etched. The silicon nitride film 34 in the transistor area is also etched and the silicon film 28 is exposed.

If the silicon oxide film 36 is not formed, etching the silicon nitride films 37 and 34 may be performed successively.

Figure 6O:
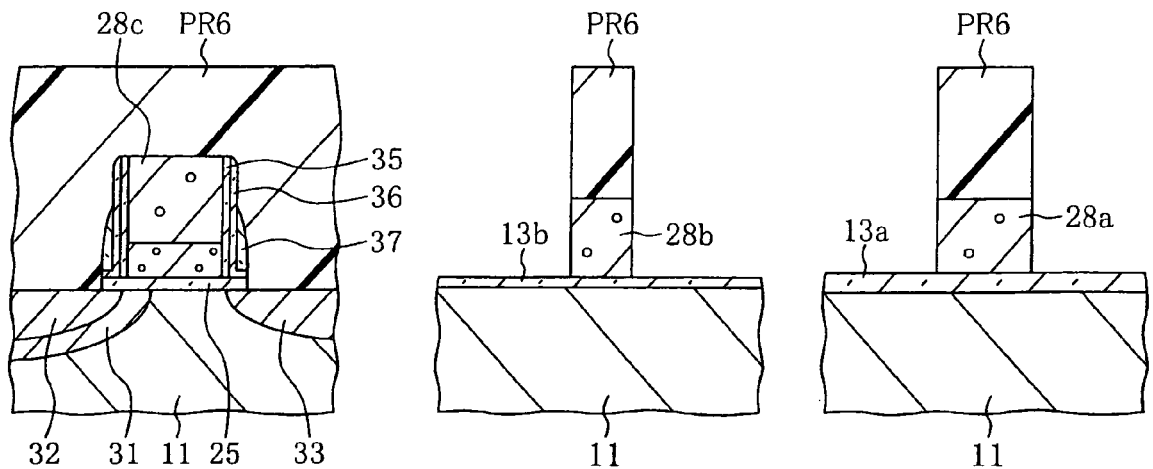

As shown in FIG. 6O, a resist pattern PR6 is formed having a gate electrode pattern in the transistor area and covering the flash memory area. By using the resist pattern PR6 as a mask, the polysilicon film 28 is etched to form gate electrodes 28a and 28b. Since the silicon nitride film 34 was removed, the layer to be etched is only a silicon layer so that high precision etching becomes easy. The resist pattern PR6 is thereafter removed.

Figure 6P:
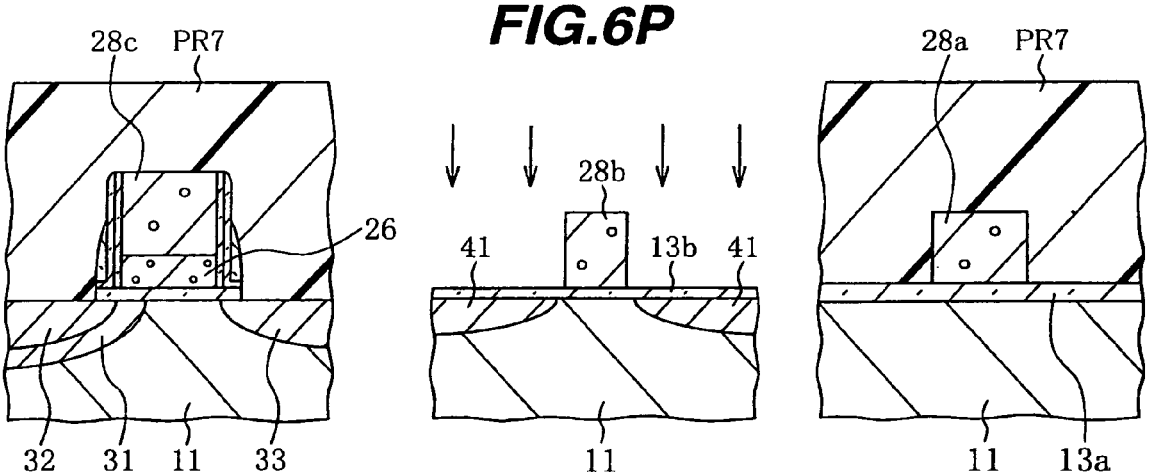

As shown in FIG. 6P, a resist pattern PR7 is formed covering the flash memory area and high voltage operation transistor area, and n-type impurity ions are implanted into the low voltage operation transistor area to form extension regions 41 of source/drain regions. The resist pattern PR7 is thereafter removed.

Figure 6Q:
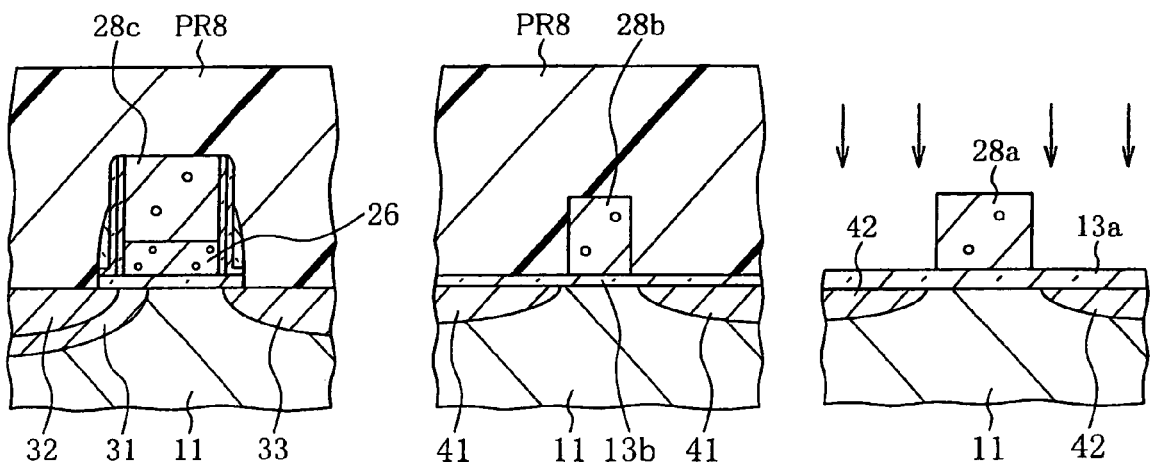

As shown in FIG. 6Q, a resist pattern PR8 is formed covering the flash memory cell area and low voltage operation transistor area. Lightly doped drain (LDD) regions 42 are formed by implanting n-type impurity ions into the high voltage operation transistor area. The resist pattern PR8 is thereafter removed. If the conditions are satisfied, extension regions and LDD regions may be formed by the same ion implantation process without separating the low and high voltage operation transistor areas.

Figure 6R:
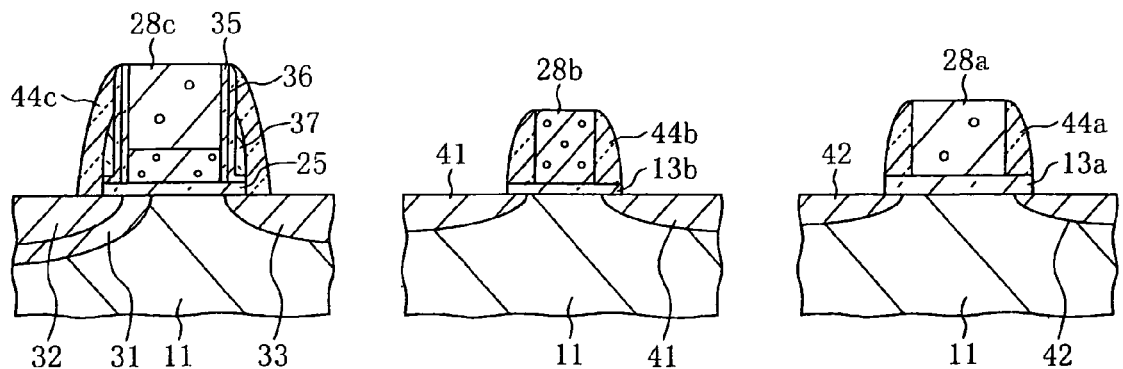

As shown in FIG. 6R, a TEOS silicon oxide film 44 is deposited on the whole substrate surface to a thickness of 80 nm to 150 nm at a substrate temperature of 600° C., and etched back to remove the silicon oxide film on the flat surface. Side wall spacers 44c of silicon oxide are formed on the side walls of the laminated gate electrode in the flash memory cell area, whereas side wall spacers 44b and 44a of silicon oxide are formed on the side walls of the gate electrodes 28b and 28a in the low and high voltage operation transistor areas.

Figure 6S:
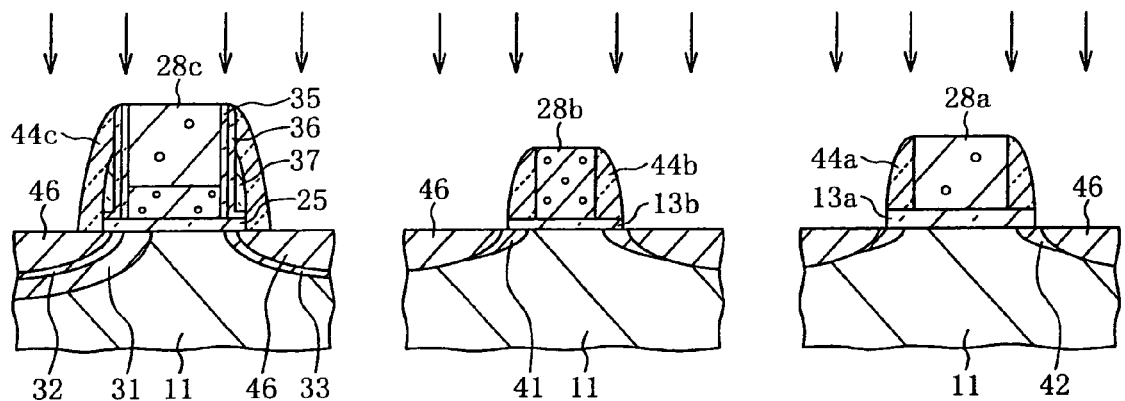

As shown in FIG. 6S, n-type impurity ions are implanted into all active regions to form source/drain regions 46.

If a CMOS circuit is to be formed, p-channel regions and n-channel regions are separated by resist patterns and n-type and p-type impurity ions are implanted.

Figure 6T:
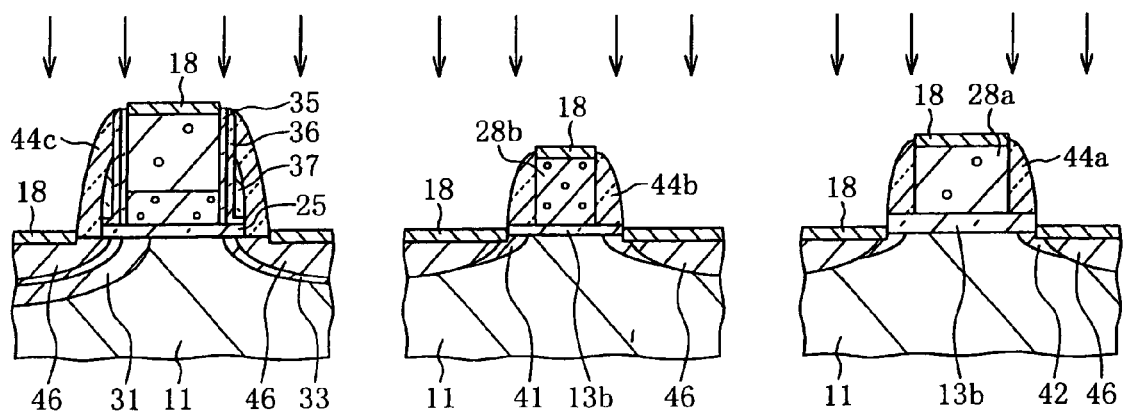

As shown in FIG. 6T, the substrate surface and gate electrode surfaces are washed with dilute hydrofluoric acid solution to remove a natural oxide film and the like, and thereafter a metal layer capable of silicidation such as Ti and Co is deposited to a thickness of about 30 nm by sputtering. If necessary, a TiN layer is further deposited and annealing is performed, for example, for 30 seconds at 500° C. to form primary silicide layers. After an unreacted metal layer and the like are removed, secondary annealing is performed, for example, for 30 seconds at 800° C. to form silicide layers 18 having a low resistance.

The silicon nitride layer does not expose on the surfaces of the side wall spacers, and the gate oxide film and TEOS silicon oxide film expose in contact with the substrate. Therefore, undercuts will not be formed and there is no problem of short circuits, strain and the like.

Figure 6U:
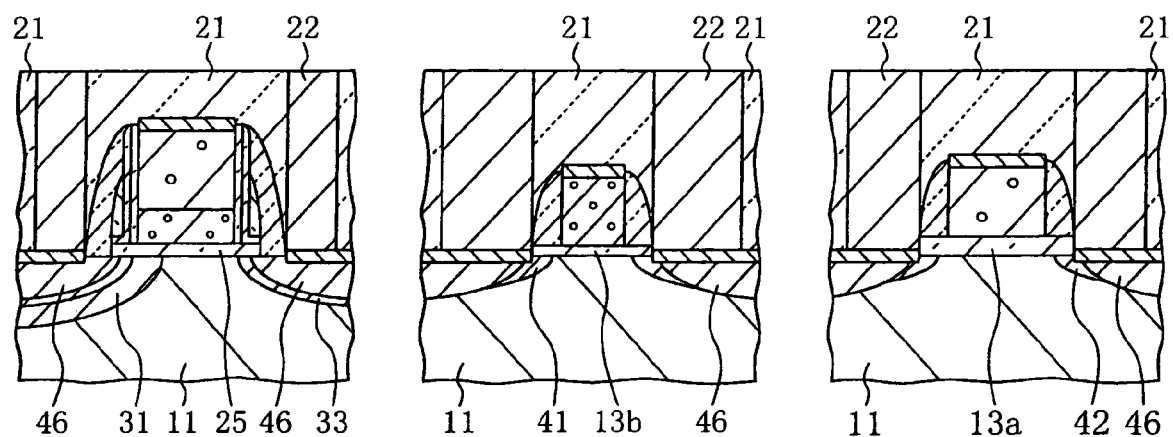

As shown in FIG. 6U, an interlayer insulating film 21 is deposited covering the gate electrode structures, and the surface thereof is planarized if necessary. Contact holes are formed through the interlayer insulating film 21, and after a Ti layer, a TiN layer and the like are formed, a W layer is deposited burying the contact holes, and an unnecessary portion is removed to form W plugs 22. In this manner, a semiconductor device mixedly integrating a plurality of types of semiconductor elements is formed. If necessary, upper level wirings are formed to form a multi-layer wiring structure. General techniques of semiconductor devices may adopt various well-known techniques (for example, refer to U.S. Pat. Nos. 6,492,734 and 6,500,710, the entire contents of which are incorporated herein by reference).

The present invention has been described in connection with the embodiments. The present invention is not limited thereto. It will be apparent to those skilled in the art that, for example, other various modifications, improvements, combinations, and the like can be made.

INDUSTRIAL APPLICABILITY

The present invention is applicable to semiconductor devices. The present invention is applicable to a semiconductor integrated circuit device mixedly mounting a plurality of types of semiconductor devices.

I claim:

1. A semiconductor device comprising:
   a semiconductor substrate;
   a first gate oxide film formed on said semiconductor substrate;
   a first gate electrode formed on said first gate oxide film;
   first source/drain regions formed in said semiconductor substrate on both sides of said first gate electrode;
   first laminated side wall spacers having two or more layers and formed on side walls of said first gate electrode, said first laminated side wall spacers including a nitride film as a layer other than an outermost layer, the outermost layer being made of an oxide film or an oxynitride film and having a bottom surface contacting said semiconductor substrate, said first gate oxide film, or one of said two or more layers other than said nitride film; and
   a laminated gate electrode structure formed on said semiconductor substrate, comprising:
   a tunneling insulating film formed on said semiconductor substrate;
   a floating gate electrode formed on said tunneling insulating film;
   an insulating film formed on said floating gate electrode; and
   a control gate electrode formed on said insulating film;
   second source/drain regions formed in said semiconductor substrate on both sides of said laminated gate electrode structure; and
   second laminated side wall spacers having three or more layers, formed on side walls of said laminated gate electrode structure, and including a nitride film as an intermediate layer not contacting said semiconductor substrate.

2. The semiconductor device according to claim 1, wherein said second laminated side wall spacers include a thermally oxidized layer as an innermost layer.

3. The semiconductor device according to claim 1, wherein said second laminated side wall spacers include an oxide film or an oxynitride film as the outermost layer whose bottom contacts said semiconductor substrate.

4. A semiconductor device comprising:
   a semiconductor substrate;
   a first gate oxide film formed on said semiconductor substrate;
   a first gate electrode formed on said first gate oxide film;
   first source/drain regions formed in said semiconductor substrate on both sides of said first gate electrode;
   first laminated side wall spacers formed on side walls of said first gate electrode;
   a laminated gate electrode structure formed on said semiconductor substrate, comprising:
   a tunneling insulating film formed on said semiconductor substrate;
   a floating gate electrode formed on said tunneling insulating film;
   an insulating film formed on said floating gate electrode; and
   a control gate electrode formed on said insulating film;
   second source/drain regions formed in said semiconductor substrate on both sides of said laminated gate electrode structure; and
   second side wall spacers having three or more layers, formed on side walls of said laminated gate electrode structure, and including a nitride film as an intermediate layer not contacting said semiconductor substrate, and an outermost side wall spacer layer directly contacting said semiconductor substrate.

5. The semiconductor device according to claim 4, wherein said first laminated side wall spacers are made of same layers as outermost side wall spacer layers of said second side wall spacers.

6. The semiconductor device according to claim 4, wherein said first laminated side wall spacers are laminated side wall spacers having two or more layers, said first laminated side wall spacers including a nitride film as a layer other than an outermost layer, the outermost layer being made of an oxide film or an oxynitride film and having a bottom surface contacting said semiconductor substrate, said first gate oxide film or one of said two or more layers other than said nitride film.

7. The semiconductor device according to claim 4, wherein the nitride film as an intermediate layer of said second side wall spacers is a silicon nitride film formed by LP-CVD.

* * * * *